Aug. 1, 1972 R. E. SZUPILLO 3,681,227

MICROCIRCUIT MASK AND METHOD

Filed June 29, 1970 3 Sheets-Sheet 1

INVENTOR.
Raymond E. Szupillo
BY William J Simmons Jr
ATTORNEY

Aug. 1, 1972 R. E. SZUPILLO 3,681,227

MICROCIRCUIT MASK AND METHOD

Filed June 29, 1970 3 Sheets-Sheet 2

INVENTOR.
Raymond E. Szupillo
BY
William J. Simmons Jr.
ATTORNEY

INVENTOR.
Raymond E. Szupillo
BY William J. Simmons Jr.
ATTORNEY

United States Patent Office 3,681,227

Patented Aug. 1, 1972

3,681,227
MICROCIRCUIT MASK AND METHOD

Raymond E. Szupillo, Big Flats, N.Y., assignor to Corning Glass Works, Corning, N.Y.

Filed June 29, 1970, Ser. No. 50,670
Int. Cl. C23c 15/00
U.S. Cl. 204—192 11 Claims

ABSTRACT OF THE DISCLOSURE

A method of making thin films of alpha $Fe_2O_3$ by a reactive sputtering technique, the parameters of which are controlled within specified ranges so that the resultant film has greater optical and physical density, greater scratch and abrasion resistance and higher refractive index than films produced by other deposition techniques or by conventional reactive sputtering. The improved iron oxide film having a thickness in the range of 500 A. to 5000 A. may be deposited on a transparent glass substrate and thereafter be patterned to form a microcircuit mask having improved properties.

BACKGROUND OF THE INVENTION

This invention relates to a method of forming improved films of alpha $Fe_2O_3$, and more particularly to a method of forming thin iron oxide films for use in making microcircuit masks.

Microcircuit masks, which consist of thin patterned films of masking material disposed on a transparent substrate, are utilized in well known processes for forming patterns in films of photosensitive resist. A mask which is suitable for use with the common negative resists contains a reverse image of the desired geometry, i.e., it contains dark areas where the substrate is to be etched. Although the following description relates to negative masks and resists, it is to be understood that positive masks can also be made from films produced in accordance with the method of the present invention, and that positive resists can be utilized. The image side of the mask is placed in direct contact with a resist coated wafer, and illumination of the proper spectral distribution is directed at the upper surface of the mask and passes through the clear areas thereof to impinge on the resist. The exposed areas of the resist become insoluble and remain behind on development, protecting the coated areas during etching. The final microcircuit product is produced by a succession of etching, diffusion and metallizing steps utilizing various patterned masks. At the present state of the art, patterns include line widths and spacings down to about 5 microns. Since device fabrication employs about six to twelve masks, each of which must register with the preceding pattern on a semiconductor wafer, and since defects in the final product are generally the sum of the flaws in the individual masks, it is obvious that the masks must be of high quality and that each mask must be properly aligned in order to obtain economical yields of semiconductor devices. Preferred masks for use in the above-described process should be transparent in the visible but absorbing in the ultraviolet portion of the spectrum, should be scratch resistant and should be capable of being photofabricated by processes that utilize common photosensitive resists and common acid etchants.

For a long period of time microcircuit masks were made from a fine-grain, silver halide emulsion-type plate. The recently introduced chromium film microcircuit mask is superior to the emulsion type plate with respect to abrasion resistance and resolution, and it is therefore being increasingly utilized. However, a serious disadvantage is encountered during the use of the standard emulsion and chromium masks, both of which are opaque in the visible region. The aforementioned alignment of the mask pattern with that on the semiconductor wafer is the most painstaking operation in the fabrication of a semiconductor wafer. This step becomes even more difficult with those masks having a large proportion of opaque area, i.e., masks having only small openings available for viewing the underlying structure. Orientation of such masks to the necessary close tolerance becomes a tedious, time-consuming task.

Several masks have been recently developed in an attempt to solve this alignment probelm. One type of transparent mask is produced by special post-development processing of high resolution emulsion-type plates to convert the silver halide image to an orange colored pattern which is transparent in the visible while remaining opaque at wavelengths effective in exposure of photoresists. This transparent emulsion-type mask is still subject to the serious abrasion limitation of the original plate.

A newly developed stained glass mask potentially combines the excellent abrasion resistant characteristics of the chromium mask with the transparency advantage of the die-converted emulsion mask. The stained glass mask is made by forming a patterned layer of metal on the surface of a glass substrate and thereafter diffusing the metal into the surface of the glass substrate. This mask is not well suited to the large scale production of working microcircuit masks since it is made by a six-step process, and since it has resolution limitations.

A microcircuit mask which overcomes the disadvantages of the prior art is disclosed in U.S. patent application Ser. No. 50,668 entitled "Transparent Iron Oxide Microcircuit Mask" filed by Edward M. Griest on even date herewith. The Griest application teaches the use of films of alpha iron oxide of suitable thickness for microcircuit masks which provide sufficient transparency in the visible region to permit rapid alignment thereof in existing types of alignment apparatus and which provide sufficient opacity in the ultraviolet region so that normal exposure procedures may be utilized. Masks can be made from iron oxide films having thicknesses in the range of 500 A. to 5000 A. However, if a masking film is too thin, the optical density thereof in the ultraviolet region will be relatively low, therefore requiring a short and very precisely controlled exposure time during use of the mask for exposing resists. Also, if a masking film is too thick, it is less transparent in the visible region and does not provide high resolution exposure of resists. It is therefore preferred that iron oxide films for use as masks generally be between 1000 A. and 4500 A. thick. Such films provide high resolution, good scratch and abrasion resistance, and can be photofabricated by methods which employ common photosensitive resists and common acid etchants. Iron oxide films possessing all of these desirable characteristics can be produced by such methods as chemical vapor reactions, vacuum evaporation and reactive sputtering. However, the specific optical and mechanical properties of thin iron oxide films are a function of both the crystalline state and grain size which are determined by the particular process by which a film is deposited. As compared with films produced by other deposition techniques, RF sputtered films have fewer pinholes and opaque spot defects. Also, since sputtering is carried out at relatively low temperatures, this process can be utilized to deposit iron oxide films on alkali containing glass substrates which are less expensive than the substantially alkali-free substrates needed for other deposition techniques.

The present invention encompasses more than merely the selection of the reactive sputtering technique as a preferred method for depositing thin films of alpha $Fe_2O_3$ for use as a microcircuit mask material. It has been discovered that precise control of sputtering parameters within given ranges produces films having optical and physical properties superior to those of films produced by chemical vapor reactions, vacuum evaporation and even those produced by conventional sputtering techniques.

SUMMARY OF THE INVENTION

It is therefore an object of the present invention to provide a method of depositing thin films of alpha $Fe_2O_3$ having high optical and physical density, improved scratch and abrasion resistance and high refractive index.

Another object of the present invention is to provide a method of making an iron oxide masking film which provides greater optical density in the ultraviolet region per unit thickness.

Another object of the present invention is to provide an improved microcircuit mask or mask blank.

Briefly, the present invention relates to an improved sputtering technique wherein a sputtering chamber must be provided with a cathode which is at least 99% pure iron. At least one substrate is disposed in the chamber spaced from the cathode. The atmosphere is continuously pumped from the chamber. A sputtering atmosphere is maintained in the chamber at a pressure in the range of $0.5–10\times10^{-3}$ torr by adding to the chamber a gas mixture comprising an inert sputtering gas and oxygen, the amount of oxygen being within the following ranges: a minimum of 0.00825 cc. per minute per liter of chamber volume and a maximum of 0.132 cc. per minute per liter of chamber volume at a deposition rate of 50 A./minute, both the maximum and minimum limits of the range of oxygen input increasing at a rate of 0.000165 cc. per minute per liter of chamber volume for each A./minute increase in deposition rate above 50 A./minute. Alpha $Fe_2O_3$ is then sputtered onto the substrate at a rate of at least 50 A./minute.

DETAILED DESCRIPTION

The method of the present invention utilizes the reactive sputtering technique to deposit a thin film of iron oxide on a substrate. Sputter deposition of thin film materials is accomplished by bombardment of a material source in a vacuum by ions in such a way that the source material is ejected and coats all line-of-site surfaces. By appropriate design of the material source, which is typically a cathode in the form of a large flat circular plate, excellent uniformity can be obtained in the properties of the deposited thin films.

Figure 1:
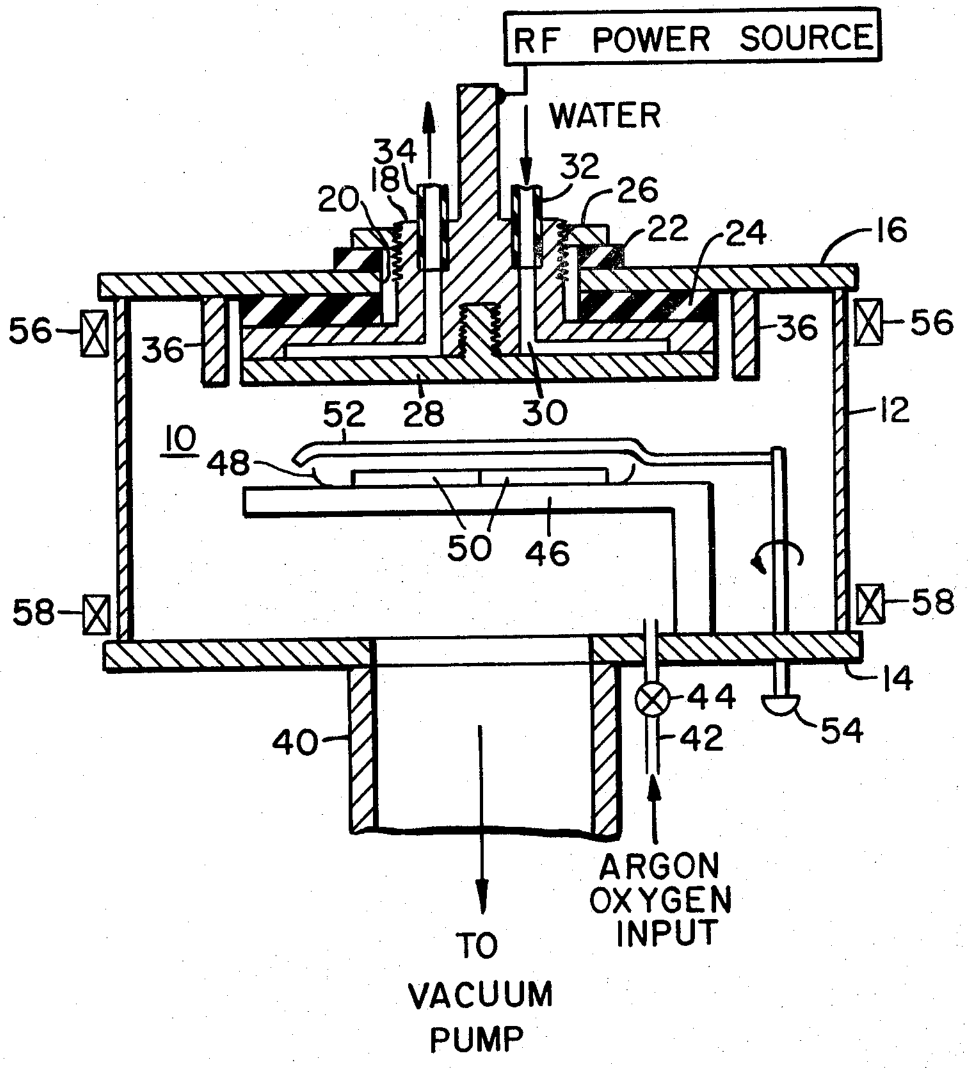
FIG. 1 is a schematic representation of the cathode sputtering apparatus utilized in the deposition of thin films of alpha $FeO_3$.

Sputtered compounds such as oxides can be deposited by reactive sputtering which is performed in an atmosphere containing a component of the material to be deposited. For example, iron oxide films can be obtained by sputtering from an iron cathode in an atmosphere containing oxygen in addition to an inert sputtering gas, which is usually argon. Other inert gases such as zenon can be used, but much better results are obtained with argon. Reference is made to FIG. 1 for an illustration of a type of reactive sputtering apparatus which may be utilized in the practice of the present invention. In this figure, which is illustrated in cross-section, a sputtering chamber 10 includes a cylindrical housing 12, a baseplate 14 and a cover plate 16. A cathode support fixture 18 is disposed adjacent to the cover plate 16 with a portion thereof projecting through opening 20. Cathode support fixture 18 is insulated from cover plate 16 by insulating washers 22 and 24 and is secured in position by a threaded cathode mount 26. A cylindrical metallic iron cathode plate 28 contains a projection which threads into cathode support fixture 18. Cooling water is supplied to passages 30 within the support fixture 18 by a pipe 32 to dissipate thermal energy generated at the cathode. Heated water is removed from fixture 18 by a pipe 34. A cylindrical shield 36 prevents sputtering from occurring from the cathode support fixture or the edge of the cathode. A pipe 40 connects the sputtering chamber 10 to a vacuum pump. A mixture of oxygen and argon is supplied to chamber 10 through a pipe 42 having a valve 44 therein. An anode 46 is spaced from cathode 28 and supports a Petri dish 48 in which one or more substrates 50 are disposed. Shutter 52 may be rotated by turning shutter rotation knob 54.

In the apparatus shown in FIG. 1 the argon ions, which bombard cathode 28, cause iron source material to be ejected and coat the exposed surface of substrate 50. Oxidation of the iron can take place at the cathode, during flight thereof after ejection from the cathode, or after deposition on the substrate, but prior to cover up by additional deposit material. Two coils 56 and 58, which surround housing 12, provide a magnetic field that pinches the discharge from the cathode and confines the discharge to an area which includes the substrates.

The simplest and most common forms of sputtering make use of DC voltages. It is desirable, however, to use RF voltages to sputter insulators at a significant rate from any insulating cathode material. It is also desirable to use RF voltages for reactive sputtering. Iron oxide can be deposited by reactive DC sputtering from a metallic iron cathode at fairly rapid rates almost equivalent to that from RF sputtering. However, the uniformity of deposits on the substrates is severely affected unless provision is made to avoid pointed projections such as the corners of a sample on the anode plate. RF sputtering is the preferred method of depositing thin iron oxide films, and therefore, the following description relates to that method of sputtering, although it is not intended that DC sputtering be excluded.

The following specific examples are provided to enable those skilled in the art to practice the method of the present invention.

Example 1

A sputtering chamber, the volume of which was 43.3 liters, was provided with a 99.95% Fe cathode disc which was 6 inches in diameter and 1/16 inch thick. The anode-cathode spacing was 1.75 inches, and the magnetic field provided by coils 56 and 58 was approximately 40 gauss. A glass substrate 2 inches square and 0.060 inch thick was provided. The substrate consisted of a glass which is substantially transparent to visible and ultraviolet light. One type of glass found to have the required characteristics is a borosilicate glass of the type disclosed in U.S. Pat. No. 1,304,623 issued to E. C. Sullivan and W. C. Taylor.

The substrate was cleaned by a particularly effective cleaning process whereby it was first soaked in a common laboratory or household detergent at room temperature for five minutes or more. Next, the plate was swabbed with cotton to remove particulate matter, and thereafter subjected successively to three separate one minute rinses in distilled deionized water to eliminate water spot formations and liquidous surface acidity. Next, the plate was subjected to ultrasonic agitation in a distilled deionized water bath for about five minutes, or more. Thereafter, the plate was again rinsed in distilled deionized water to remove any surface matter which may have been collected on the plate during the foregoing ultrasonic agitation step.

The plate was blown dry with filtered clean dry air to remove water droplets and spots. A conventional vapor degreaser was thereafter used to rinse away any remaining water from the plate with isopropyl alcohol vapor.

Finally, the plate was baked in clean filtered dry air for about thirty minutes or more in a temperature range between about 180° C. and 200° C. In the foregoing manner, surface contamination of the plate was substantially reduced thereby eliminating a possible source of film defect formation.

The cleaned substrate was placed in Petri dish 48 and placed on the anode plate 46, the shutter 52 covering dish 48. The sputtering chamber 10 was then closed and pumped to a pressure less than $10^{-6}$ torr. Valve 44 was adjusted so that a sputtering gas mixture consisting of 95% argon and 5% oxygen was introduced into the sputtering chamber at a rate of 2.5 cc./liter volume of sputtering chamber per minute. This provided a gas thruput of approximately 100 cc. per minute. The RF power was turned on, adjusted to maximum output, and a presputter was made for twenty minutes, depositing from a six inch diameter cathode onto shutter 52. The shutter was then opened and power was readjusted to an optimum level, the RF voltage being 4000 volts peak-to-peak at a frequency of 13.56 megahertz. This provided an average power density of 24 watts/square inch of cathode area. The deposition pressure was adjusted to $5\times10^{-3}$ torr, and sputtering was continued at a deposition rate of about 140 A./minute until the proper thickness was reached. After deposition was completed, power was turned off, and the system allowed to cool for 5–10 minutes before it was opened and the sample removed.

The time required to deposit a film suitable for a microcircuit mask was usually 12.5 to 20 minutes, depending upon deposition rate. The latter varied with supply voltage fluctuations, anode-cathode spacing, deposition pressure, and sputtering gas thruput.

The following table contains ten additional examples of film deposition runs, substrate preparation and cathode purity remaining the same as that disclosed in Example 1.

centimeters at room temperature and atmospheric pressure that must be added to a sputtering chamber for each liter of chamber volume during each minute of deposition as a function of deposition rate in A./minute. Vertical line 62 indicates that the minimum deposition rate is about 50 A./minute. This is a somewhat arbitrary cutoff point, but below this rate the iron oxide films become noticeably more typical, i.e., the optical and physical densities are noticeably lower. Line 64 intersects line 62 at a point representative of 0.00825 cc. of oxygen and line 66 intersects line 62 at 0.132 cc. of oxygen. Both lines 64 and 66 have a slope of +0.000165 cc. per minute per liter for each angstrom increase in deposition rate above 50 A.

Figure 2:
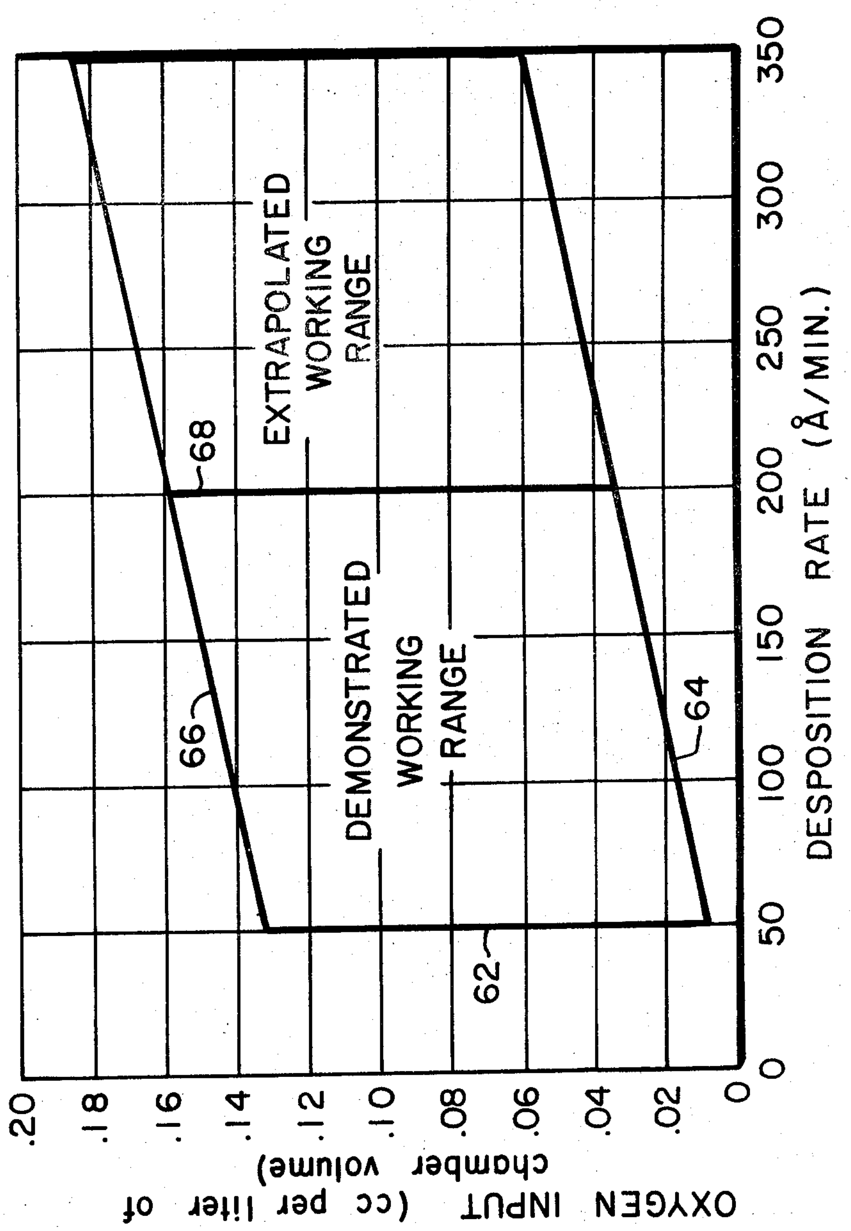
FIG. 2 is a graph illustrating the amount of oxygen to be supplied to a sputtering chamber as a function of deposition rate.

After establishing a deposition rate it is preferable to choose a rate of oxygen input in the center of the range indicated by FIG. 2. For example, if it were desired to sputter at 100 A./minute, the amount of oxygen to be added to the chamber for each liter of chamber volume is between 0.016 and 0.14 cc./minute. However, best results are obtained when the oxygen input is in the central portion of this range at about 0.078. Referring to the table, one of the headings is labeled "Required Oxygen—High, Low." The values in these two columns are obtained from FIG. 2. The last column in the table is the actual oxygen thruput which is generally in the central portion of the indicated range. Having determined the oxygen thruput, argon or some other inert sputtering gas is also added to the chamber at a rate sufficient to bring the sputtering pressure up to a value within the previously specified range of $0.5–10\times10^{-3}$ torr.

To obtain the improved, dense iron oxide film, it appears that iron should be sputtered from the cathode as a metal and that it should be oxidized during transit or after depositing but before it is covered by more iron metal or oxide. If there is insufficient oxygen in the

| Example | Cathode diameter, inches | Power density, watts/inches squared | Sputtering pressure, microns | Anode cathode spacing, inches | Deposition rate, A./min. | Gas thruput, cc./min. | chamber volume, liters | Required cc. per liter oxygen, at deposition rate | | Actual gas, percent | | Oxygen thruput, cc./liter of vol. |
|---|---|---|---|---|---|---|---|---|---|---|---|---|
| | | | | | | | | High | Low | Argon | Oxygen | |
| 2 | 6 | 24 | 5 | 1.75 | 148 | 50 | 43.3 | 0.148 | 0.0244 | 95 | 5 | 0.0577 |
| 3 | 6 | 24 | 5 | 1.75 | 141 | 100 | 43.3 | 0.147 | 0.0232 | 95 | 5 | 0.1154 |
| 4 | 6 | 24 | 5 | 2.5 | 96 | 100 | 43.3 | 0.139 | 0.0158 | 95 | 5 | 0.1154 |
| 5 | 6 | 24 | 2 | 1.75 | 135 | 100 | 43.3 | 0.146 | 0.0223 | 95 | 5 | 0.1154 |
| 6 | 6 | 12 | 5 | 1.75 | 71 | 100 | 43.3 | 0.135 | 0.0117 | 95 | 5 | 0.1154 |
| 7 | 6 | 24 | 5 | 1.75 | 160 | 100 | 43.3 | 0.150 | 0.0264 | 97.5 | 2.5 | 0.1154 |
| 8 | 24 | 12 | 5 | 2.5 | 75 | 100 | 219 | 0.136 | 0.0123 | 76 | 24 | 0.1096 |
| 9 | 24 | 24 | 5 | 2.5 | 150 | 100 | 219 | 0.148 | 0.0247 | 76 | 24 | 0.1096 |
| 10 | 6 | 24 | 5 | 1.75 | 360 | 25 | 43.3 | 0.183 | 0.0594 | 95 | 5 | 0.0289 |
| 11 | 24 | 24 | 5 | 2.5 | 390 | 100 | 219 | 0.188 | 0.0644 | 95 | 5 | 0.0228 |

Examples 2 through 9 resulted in the deposition of improved iron oxide films having high optical density in the ultraviolet region, high physical density and high refractive index. Examples 10 and 11 did not produce an improved iron oxide film but resulted in reduced iron oxide films. The previously listed examples and other numerous examples resulted in the establishment of necessary conditions for the production of improved films. Whereas typical cathodes for deposition of iron oxide have consisted of cast iron (98% Fe), the cathode material must be at least 99% Fe to obtain improved films. Also, instead of depositing films at conventional deposition pressures of $2–5\times10^{-2}$ torr, the improved method requires pressures in the range of $0.5–10\times10^{-3}$ torr. Moreover, deposition rates of at least 50 A./minute are required for the deposition of improved films, whereas no minimum deposition rates were previously specified for iron oxide films. Conventional sputtering is usually performed in an atmosphere consisting of argon and at least 1% oxygen. In accordance with the present invention, the amount of oxygen added to the sputtering chamber is determined by the graph shown in FIG. 2, which is the result of information gathered from many sputtering runs in which the oxygen input rates were varied. FIG. 2 is a graph illustrating the amount of oxygen in cubic chamber to oxidize all of the deposited iron before it is covered by subsequent deposits, the resultant films are not fully oxidized and are therefore not transparent in the visible region. These reduced films are also less dense than the desired films of alpha $Fe_2O_3$. Such reduced films are produced when the oxygen input is below the minimum amount indicated by line 64. This line represents a rather abrupt change between acceptable and unacceptable films, the films resulting from an oxygen input below line 64 being noticeably poor in density and in optical characteristics.

The change in the characteristics of films resulting from oxygen inputs above and below line 66 are not as abrupt as the changes in film characteristics above and below line 64. As indicated previously, iron should be sputtered from the cathode as a metal. As the oxygen input increases above the levels defined by line 66, the cathode becomes oxidized, and a film sputtered therefrom is not as dense as the improved type of film. Whereas the iron cathode should have a silvery bright metallic appearance, the appearance of an oxidized cathode changes to black, brown and then orange as it becomes more oxidized. An oxidized cathode results in a low deposition rate and causes the deposition of a film that is less dense than the desired film.

It has been found that conventional sputtering equipment will deposit the improved iron oxide films at rates up to about 200 A./minute. Therefore the area enclosed by lines 62, 64, 66 and 68 is labeled "demonstrated working range." However, refined sputtering equipment could extend the rate of deposition to the right of line 68 into the area labeled extrapolated working range. In such refined equipment the deposition rate could be increased, for example, by reducing the anode-cathode spacing. Of course, some limit would be reached beyond which sputtering could not be maintained.

In summary, the graph shown in FIG. 2 indicates a range of rates at which oxygen must be supplied to a sputtering chamber for each liter of chamber volume. The end points of the range of rates of oxygen flow depend upon the film deposition rate. The gas input to the sputtering chamber thus consists of a mixture of an inert sputtering gas plus oxygen, the amount of which is within the following ranges: a minimum of 0.00825 cc. per minute per liter of chamber volume and a maxmium of 0.132 cc. per minute per liter of chamber volume at a deposition rate of 50 A./minute, both the minimum and the maximum limits of the ranges of oxygen input increasing at rates of 0.000165 cc. per minute per liter of chamber volume for each A./minute increase in deposition rate above 50 A./minute.

The resultant film produced by the method of this invention is the fully-oxidized form of iron, namely alpha $Fe_2O_3$, which is also known as hematite. It is this form of iron oxide that possesses the best properties for use in a microcircuit mask. Alpha $Fe_2O_3$ is reddish-brown on white light transmission in film thicknesses less than about 5000 A. Thicker films tend toward the deep ruby red as they become thick enough to be considered opaque, i.e., when the thickness is above 5000 A. Films less than 500 A. thick do not have sufficient optical density in the ultraviolet region. Since the method of this invention produces films which provide more opacity to ultraviolet light per unit of thickness than those produced by any other method, the thickness of masking films produced by this method may be less than that of films deposited by other methods. The reflectivity of these films depends upon optical interference effects which are related to their thickness. Alignment of the mask by an operator is simpler when reflectivity is minimized. Reflectivity is at a minimum, for example, when the thickness of masking films deposited in accordance with the method of this invention is between 1700 A. and 2000 A.

Thin films of alpha $Fe_2O_3$ can also be deposited by chemical vapor deposition, conventional sputtering and vacuum evaporation, as well as by the improved RF reactive sputtering method of the present invention. The thin iron oxide films produced by these four methods are not identical, but they are somewhat similar. Those properties, including optical density, optical transmission, physical density, refractive index and hardness, differ somewhat depending on the method of film deposition, but these properties are of acceptable quality for microcircuit mask application regardless of the method of deposition. To provide a basis for comparing the films produced by the method of this invention with films produced by the other three methods listed hereinabove, the typical characteristics of films of alpha iron oxide less than 5000 A. thick produced by these other three methods, considered as a group, are as follows: (1) an optical density of 0.5 to 1.1 per 1000 A. of thickness in the ultraviolet region wherein photoresists are sensitive, (2) a visible transparency allowing up to 63% transmission or an average optical density through a standard observer filter of about 0.2 per 1000 A., (3) a physical density of approximately 80% of theoretical crystalline alpha iron oxide, (4) a physical hardness or scratch resistance similar to that of fused powders, and (5) a white light index of refraction in the range of 2.52 to 2.60. Optical density measurements were obtained by integrating optical density over a given range of optical wavelengths. For example, the optical density in the ultraviolet region was obtained by the use of a photoresist photometer having a mercury arc lamp light source and a standard photoresist evaluation filter. These properties are typical of those films produced by the utilization of common deposition techniques to achieve thin films of alpha iron oxide on a glass substrate for use as a microcircuit mask material.

Figure 3:
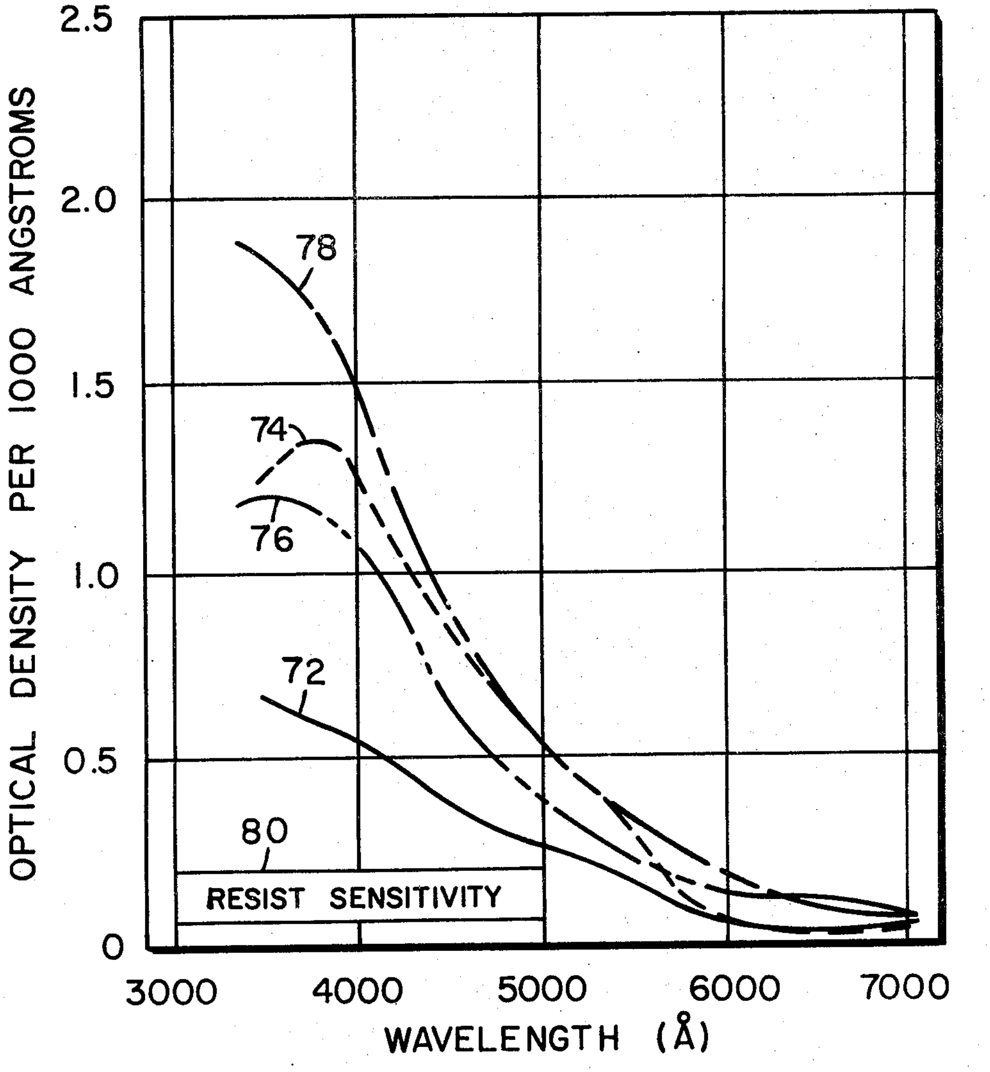
FIG. 3 is a graph of optical density per 1000 A. of film thickness vs. wavelength for films of iron oxide, alpha $Fe_2O_3$, formed by four different methods.

The improved RF sputtering method of the present invention produces films having optical and mechanical properties which cause this method to be preferred. The optical densities of films produced by the four different methods are compared in FIG. 3 which is a graph of the optical density per thousand angstroms vs. wavelength. Curve 72 relates to an iron oxide film deposited by a chemical fuming process. Curve 74 relates to a film produced by a vacuum evaporation technique which is disclosed in my co-pending U.S. patent application Ser. No. 50,669 entitled "Method of Forming Thin Films of Alpha $Fe_2O_3$." Curve 76 relates to a film produced by a typical RF sputtering process utilizing a cast iron cathode (98% Fe), the deposition pressure being in the range of $2-5\times10^{-3}$ torr and the deposition atmosphere consisting of an inert sputtering gas and at least 1% oxygen. Curve 78 relates to a film produced in accordance with the method of the present invention. Box 80 illustrates that band of ultraviolet light to which most photosensitive resists are sensitive. The curves in FIG. 3 illustrate that thin iron oxide films produced by any of the four described methods are relatively opaque to ultraviolet light below about 5000 A. and are relatively transparent to visible light above about 5500 A. However, curve 78 clearly shows that iron oxide films produced by the method of the present invention provide a greater opacity in the ultraviolet region per unit thickness than that provided by iron oxide films deposited by any other method.

One of the most important advantages of iron oxide films produced in accordance with the present invention results from their increased optical density in the ultraviolet region. The ultraviolet optical density of such films ranges between 1.1 and 1.74 per 1000 A. and was about 1.38 for the conditions set forth in Example 1 described hereinabove. In the visible region, the iron oxide film formed by the improved RF sputtering method has an optical density similar to that of films produced by other methods, although not as low as that obtainable from the method of my above-identified application Ser. No. 50,669. Thus, to provide an iron oxide film of a given ultraviolet density, the method of the present invention permits the use of a thinner film. Advantages in photofabrication resolution and transparency are obtained by the use of microcircuit masks made from such thin films. Likewise, for a given film thickness, the improved iron oxide film will have a higher optical density in the ultraviolet region providing significantly less chance for marginal density effects.

The physical density of the iron oxide film produced in accordance with the method of the present invention is also increased such that the index of refraction is above 2.6 and is typically in the range 3.2 for films made in accordance with the hereinabove disclosed specific example. The physical density of such films is estimated to be at 94–95% of theoretical at an index of 3.2. It is to be noted that this index is for white light and can be most conveniently calculated from measured film thickness and interference-reinforcement principles.

Physical hardness is increased by both the increase in physical density and by the crystallite size apparent in the films formed in accordance with the present invention. Typical crystallite size resulting from the deposition of iron oxide by ordinary methods is of the order of 3–5000 A. For the improved film, the crystallite size is on the mean order of 20–50 A. This results in an improvement in scratch resistance of approximately ten times, i.e., laboratory scratch tests require approximately ten times the abrasion to wear or scratch through a given thickness of film, as compared with iron oxide films produced by other techniques.

I claim:

1. A method of forming a thin film of iron oxide, alpha $Fe_2O_3$, comprising the following steps:
providing an RF sputtering chamber having a cathode therein which is at least 99% pure iron,
disposing at least one substrate in said chamber spaced from said cathode,
pumping the atmosphere from said chamber,
maintaining a sputtering atmosphere in said chamber at a pressure in the range of $0.5–10\times10^{-3}$ torr by adding to said chamber a gas mixture comprising an inert sputtering gas and oxygen, the amount of oxygen being within the following ranges; a minimum of 0.00825 cc. per minute per liter of volume of said chamber and a maximum of 0.132 cc. per minute per liter of volume of said chamber at a deposition rate of 50 A./minute, both the maximum and minimum limits of said range of oxygen input increasing at a rate of 0.000165 cc. per minute per liter of volume of said chamber for each A./minute increase in deposition rate above 50 A./minute, and
sputtering alpha $Fe_2O_3$ onto said substrate at a rate of at least 50 A./minute, whereby a dense, abrasion resistant, high refractive index film is formed.

2. A method in accordance with claim 1 which further comprises the step of reducing the pressure in said chamber to less than $10^{-6}$ torr prior to maintaining a sputtering atmosphere in said chamber.

3. A method in accordance with claim 1 further comprising the steps of disposing a shutter over said substrate and sputtering onto said shutter at a power density that is higher than that of said sputtering step prior to the step of sputtering onto said substrate.

4. A method in accordance with claim 1 wherein said cathode is at least 99.95% pure iron.

5. A method in accordance with claim 1 which further comprises the step of removing selected portions of said film of alpha $Fe_2O_3$.

6. A method of forming a thin film of iron oxide, alpha $Fe_2O_3$ having a physical density of at least 94% of theoretical density, comprising the following steps:
providing an RF sputtering chamber having a cathode therein which is at least 99% pure iron,
providing a substrate,
cleaning a surface of said substrate to substantially remove foreign contaminants,
disposing said substrate in said chamber spaced from said cathode,
pumping the atmosphere from said chamber,
introducing into said chamber a mixture of oxygen and an inert sputtering gas, said oxygen and said inert gas being introduced at such a rate that the pressure in said chamber is increased to $0.5–10\times10^{-3}$ torr, the amount of oxygen in said gas mixture being within the following ranges: a minimum of 0.00825 cc. per minute per liter of volume of said chamber and a maximum of 0.132 cc. per minute per liter of volume of said chamber at a deposition rate of 50 A./minute, both the maximum and minimum limits of said range of oxygen input increasing at a rate of 0.000165 cc. per minute per liter of volume of said chamber for each A./minute increase in deposition rate above 50 A./minute, and
sputtering alpha $Fe_2O_3$ onto said substrate at a rate of at least 50 A./minute, whereby a dense, abrasion resistant, high refractive index film is formed.

7. A method in accordance with claim 6 wherein the step of pumping the atmosphere from said chamber comprises reducing the pressure in said chamber to less than $10^{-6}$ torr.

8. A method in accordance with claim 7 wherein the atmosphere is continuously pumped from said chamber and said mixture of oxygen and inert gas is continuously supplied to said chamber.

9. A method of making a transparent microcircuit mask comprising the following steps:
providing an RF sputtering chamber having a cathode therein which is at least 99% pure iron,
disposing at least one transparent glass substrate in said chamber spaced from said cathode,
pumping the atmosphere from said chamber,
maintaining a sputtering atmosphere in said chamber at a pressure in the range of $0.5–10\times10^{-3}$ torr by adding to said chamber a gas mixture comprising an inert sputtering gas and oxygen, the amount of oxygen being within the following ranges:
a minimum of 0.00825 cc. per minute per liter of volume of said chamber and a maximum of 0.132 cc. per minute per liter of volume of said chamber at a deposition rate of 50 A./minute, both the maximum and minimum limits of said range of oxygen input increasing at a rate of 0.000165 cc. per minute per liter of volume of said chamber for each A./minute increase in deposition rate above 50 A./minute,
sputtering alpha $Fe_2O_3$ onto said substrate at a rate of at least 50 A./minute until a film thickness between 500 A. and 5000 A. is achieved, whereby a dense abrasion resistant, high refractive index film is formed, and
forming a pattern in said film of alpha $Fe_2O_3$ by removing selected portions thereof.

10. A method in accordance with claim 9 which further comprises the step of cleaning the surface of said substrate prior to disposing the same in said chamber.

11. A method in accordance with claim 9 wherein said sputtering step is continued until a film thickness between 1700 A. and 2000 A. is achieved.

References Cited

UNITED STATES PATENTS 3,258,413 6/1966 Pendergast .......... 204—192

JOHN H. MACK, Primary Examiner

S. S. KANTER, Assistant Examiner

U.S. Cl. X.R.

117—211